United States Patent
Levy

(10) Patent No.: US 7,773,034 B2
(45) Date of Patent: Aug. 10, 2010

(54) METHOD FOR ACQUISITION OF GPS SIGNALS AND GPS RECEIVER WITH SAMPLE TIME ERROR AND FREQUENCY OFFSET COMPENSATION

(75) Inventor: Sharon Levy, Hadera (IL)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 11/616,581

(22) Filed: Dec. 27, 2006

(65) Prior Publication Data

US 2008/0158050 A1 Jul. 3, 2008

(51) Int. Cl.
*G01S 1/00* (2006.01)
(52) U.S. Cl. .................................. 342/357.02
(58) Field of Classification Search ................................
342/357.01–357.17
See application file for complete search history.

(56) References Cited

U.S. PATENT DOCUMENTS 5,663,733 A * 9/1997 Lennen ................... 342/357.12
5,940,027 A 8/1999 Forseth et al.
6,028,887 A * 2/2000 Harrison et al. .............. 375/147
2003/0154025 A1* 8/2003 Fuchs et al. ................... 701/213
2005/0147191 A1* 7/2005 Geier et al. ................... 375/344

FOREIGN PATENT DOCUMENTS

| JP | 13-021634 | 1/2001 |
| KR | 1020030037891 | 5/2003 |
| KR | 1020030063613 | 7/2003 |
| WO | WO-2008082832 A1 | 7/2008 |

* cited by examiner

*Primary Examiner*—Thomas H Tarcza
*Assistant Examiner*—Nga X Nguyen
(74) *Attorney, Agent, or Firm*—Schwegman, Lundberg & Woessner, P.A.; Gregory J. Gorrie

(57) ABSTRACT

Embodiments of a method for acquisition of GPS signals and a GPS receiver with sample time error and frequency offset compensation are generally described herein. Other embodiments may be described and claimed. In some embodiments, GPS signals are resampled at a plurality of sample rates for each of a plurality of predetermined frequency offsets to compensate for sample time error and frequency offset of a crystal oscillator. The resampled GPS signals may be cross correlated for each of the predetermined frequency offsets. In some embodiments, the sample time error and the frequency offset of the crystal oscillator may substantially exceed a time and frequency drift of reference clocks on GPS satellites.

20 Claims, 3 Drawing Sheets

METHOD FOR ACQUISITION OF GPS SIGNALS AND GPS RECEIVER WITH SAMPLE TIME ERROR AND FREQUENCY OFFSET COMPENSATION

TECHNICAL FIELD

The present invention pertains to spread spectrum receivers. Some embodiments pertain to global positioning system (GPS) receivers. Some embodiments pertain to the acquisition of GPS signals.

BACKGROUND

Conventional GPS receivers acquire signals from GPS satellites with a precise local oscillator (LO) signal (i.e., with little frequency offset) and with a precise sample clock. Because GPS receivers operate at extremely low signal levels, long coherent combining of received GPS symbols is performed. The coherent time is generally limited by the LO frequency drift and sample clock time errors with respect to the GPS signals. In a conventional GPS receiver, a crystal oscillator used to generate these precise signals is relatively expensive and is typically accurate to within about 0.5 parts-per-million (ppm). The use of less expensive crystal oscillators with a greater time/frequency drift error (e.g., up to accuracy levels of +/−20 ppm) may result in sampling the received signals at incorrect sample times and/or performing correlations with excessive frequency offsets. This makes it difficult, if not impossible, to acquire the GPS signals.

Thus, there are general needs for GPS receivers that can acquire GPS signals using less expensive and/or less accurate crystal oscillators. There are also needs for GPS receivers that compensate for the sample time error and frequency offset due to less expensive and/or less accurate crystal oscillators, particularly during signal acquisition.

DETAILED DESCRIPTION

The following description and the drawings sufficiently illustrate specific embodiments of the invention to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for those of other embodiments. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Figure 1:
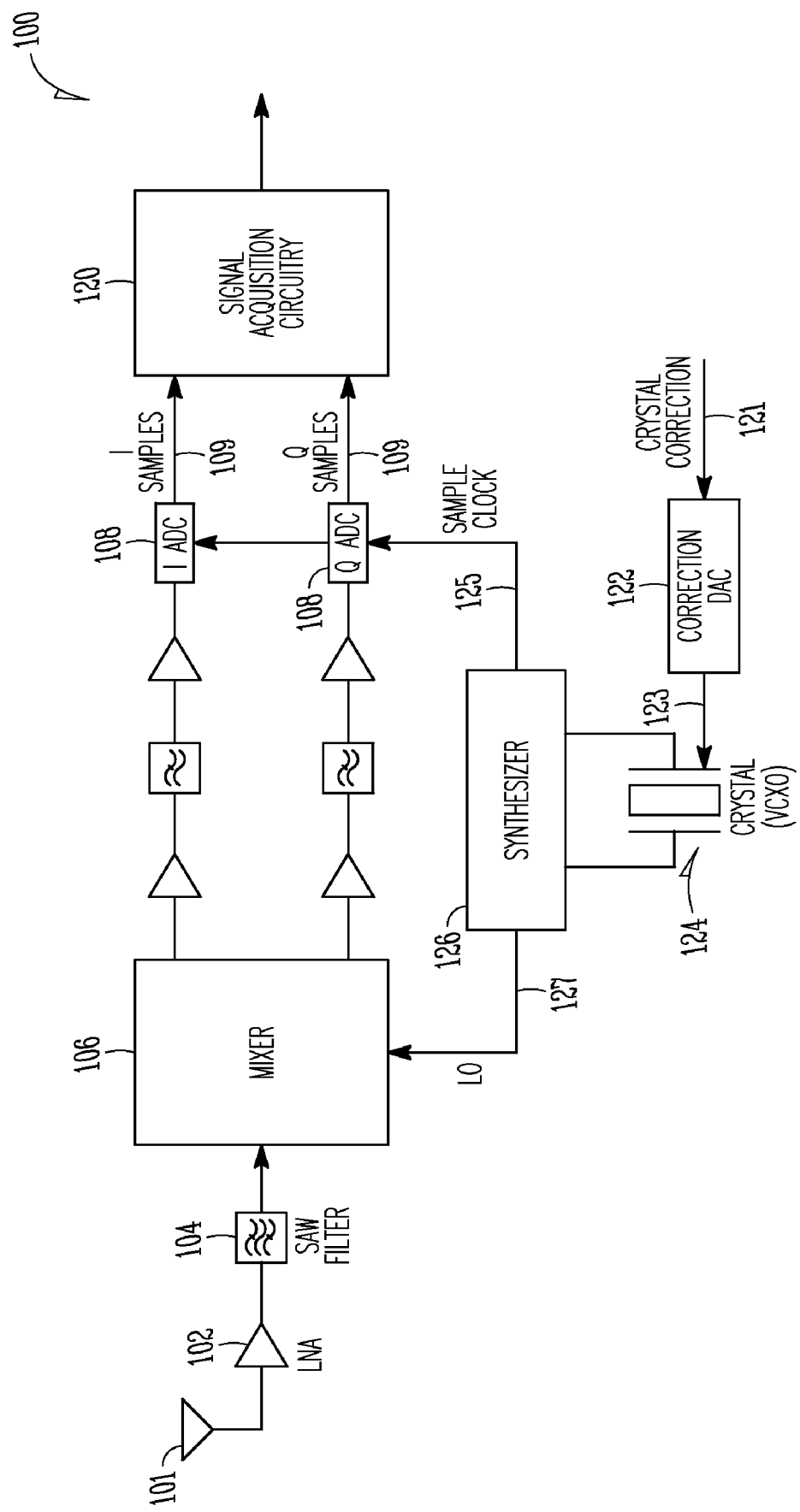
FIG. 1 is a simplified block diagram of a GPS receiver in accordance with some embodiments of the present invention.

FIG. 1 is a simplified block diagram of a GPS receiver in accordance with some embodiments of the present invention. GPS receiver 100 receives GPS signals through antenna 101. The signals may be amplified by low-noise amplifier (LNA) 102 and filtered by band-pass filter 104, which may be a surface-acoustic-wave (SAW) filter. Mixer 106 may down-convert the signals to baseband quadrature signals, such as I (in-phase) and Q (quadrature phase) signals, using LO signal 127. After further filtering and amplification, the I and Q signals may be converted to I and Q samples 109 by analog-to-digital converters (ADCs) 108 based on sample clock signal 125. I and Q samples 109 may be used by signal acquisition circuitry 120 to acquire signals from the GPS satellites. I and Q samples 109 may also be used by other portions of GPS receiver 100 (not illustrated) after signal acquisition for data demodulation and tracking.

GPS receiver 100 may also include synthesizer 126, which may generate both LO signal 127 and sample clock signal 125, using crystal oscillator 124 as a reference. Crystal oscillator 124 may be a voltage controlled crystal oscillator (VCXO), whose output frequency may be varied based on correction voltage 123 to compensate for frequency drift of LO signal 127 and time offset of sample clock signal 125. In some embodiments, GPS receiver 100 may include correction digital-to-analog converter (DAC) 122 to convert crystal correction signal 121 from a digital signal to an analog signal. The generation of crystal correction signal 121 is discussed in more detail below.

In accordance with embodiments of the present invention, signal acquisition circuitry 120 may acquire GPS signals by resampling GPS signals at a plurality of sample rates for each of a plurality of predetermined frequency offsets to compensate for sample time error and frequency offset of crystal oscillator 124. Signal acquisition circuitry may also cross-correlate the resampled samples for each of the predetermined frequency offsets to compensate for sample time error and frequency offset of crystal oscillator 124. In these embodiments, the sample time error and the frequency offset of crystal oscillator 124 may substantially exceed the time and frequency drift of reference clocks on GPS satellites (e.g., +/−20 ppm vs. 2.5 ppm), which may primarily be caused by satellite movement, although the scope of the invention is not limited in this respect.

In these embodiments, the predetermined frequency offsets may comprise all possible frequency offsets between a reference frequency (i.e., LO signal 127) generated by crystal oscillator 124 and a reference frequency of reference clocks of the GPS satellites. In these embodiments, samples 109 used by acquisition circuitry 120 may comprise complex I and Q samples generated from the received signals by ADCs 108.

In these embodiments, the resampling may be performed at different locations (i.e., different sample time offsets) within samples 109, and the cross correlating may be performed for different frequency offsets. This may cover both the Doppler induced frequency offset due to satellite velocity as well as any frequency offset due to crystal oscillator 124. In some embodiments, the resampling may be performed in parallel for each of the plurality of sample rates, although the scope of the invention is not limited in this respect.

Although GPS receiver 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), and combinations of various hardware and logic circuitry for performing at least the functions described herein. In some embodiments, the functional elements of GPS receiver 100 may refer to one or more processes operating on one or more processing elements.

Although GPS receiver 100 is described as a receiver for receiving and acquiring GPS signals, the scope of the invention is not limited in this respect and is applicable to the acquisition of any spread-spectrum signals modulated with code sequences, such as pseudo-random noise (PN) codes. Although GPS receiver 100 uses a direct down conversion receiver (i.e., zero intermediate frequency (IF)), the scope of the invention is not limited in this respect as other types of receiver configurations, such as super-heterodyne receivers and low-IF receivers, may also be suitable.

In some embodiments, crystal oscillator 124 may be common to several sub-systems within a communication system. In these embodiments, the crystal frequency may be aligned to a specific offset according to one of the sub-systems that use it. For example, in some embodiments, when crystal oscillator 124 is used within a bi-directional communication system, such as a cellular system, it may be aligned to satisfy an offset requirement for signal transmission. Therefore, circuitry within GPS receiver 100, which also uses crystal oscillator 124, may compensate for the crystal error, as described herein.

Figure 2A:
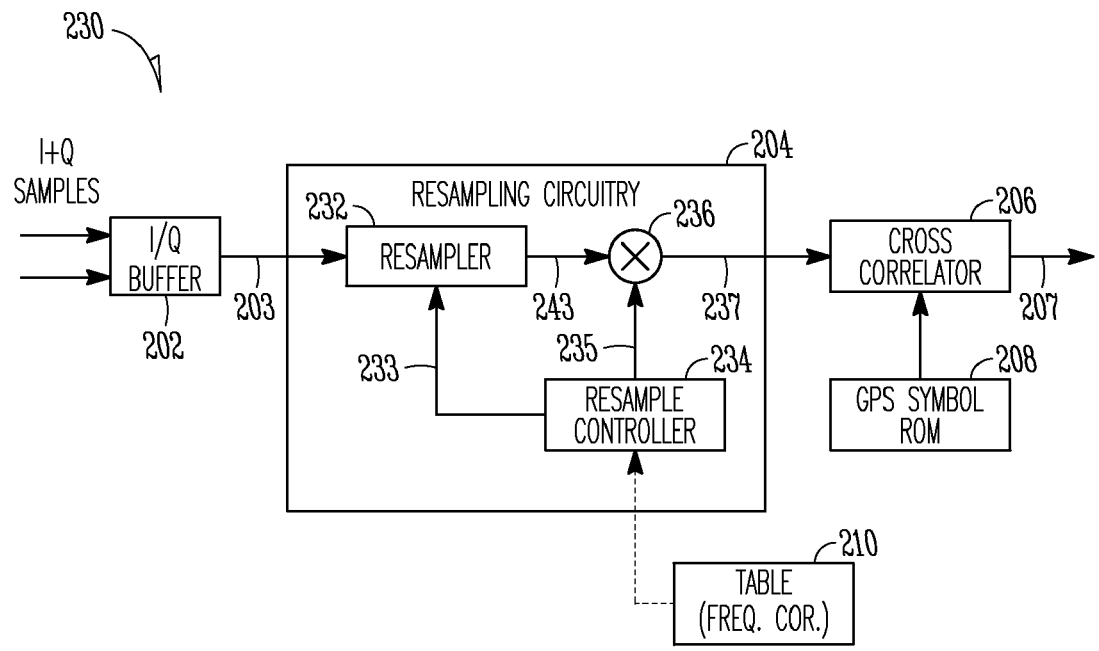
FIGS. 2A, 2B, and 2C are functional block diagrams of signal acquisition circuitry in accordance with some embodiments of the present invention.
Figure 2B:
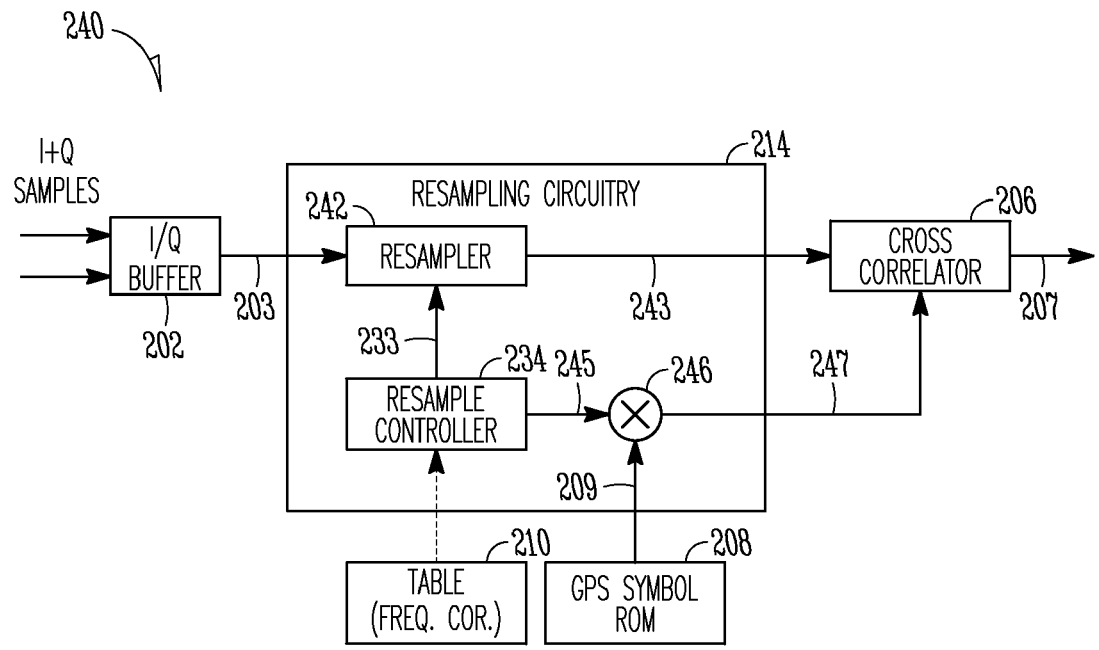
Figure 2C:
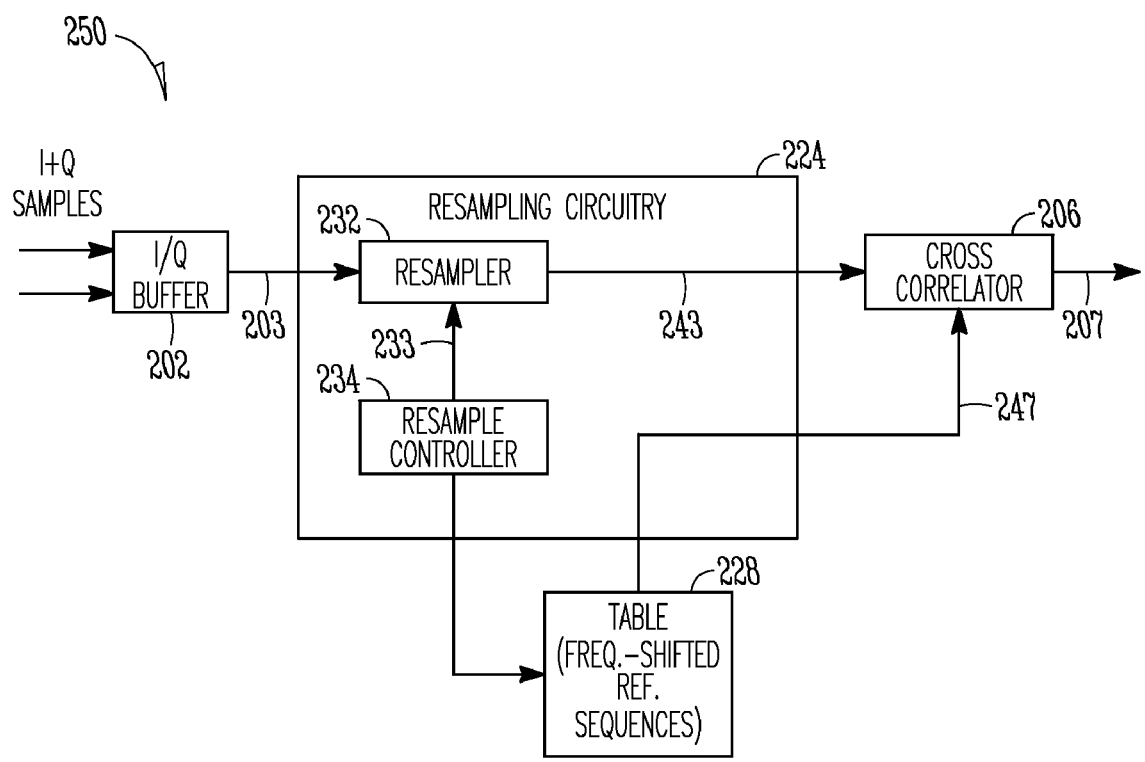

FIGS. 2A, 2B, and 2C are functional block diagram of signal acquisition circuitry in accordance with some embodiments of the present invention. Signal acquisition circuitry 230 (FIG. 2A), signal acquisition circuitry 240 (FIG. 2B) and/or signal acquisition circuitry 250 (FIG. 2C) may be suitable for signal acquisition circuitry 120 (FIG. 1).

Referring to FIG. 2A, signal acquisition circuitry 230 may include I/Q buffer 202 to buffer complex I and Q samples 109 (FIG. 1), resampling circuitry 204 to resample buffered samples 203 at a plurality of sample rates 233, and cross correlator 206 to cross correlate resampled signals 243 for each of a plurality of predetermined frequency offsets 235. The resampling operations performed by the resampling circuitry 204 at the plurality of sample rates, and the cross correlation operations performed by the cross correlator 206 for the predetermined frequency offsets may compensate for sample time error and frequency offset of a crystal oscillator 124 (FIG. 1) within the GPS receiver.

In these embodiments, the resampling may be performed at different time locations (i.e., different sample time offsets) within samples of GPS signals to cover any time offset of sample clock signal 125 (FIG. 1). The cross correlations may be performed for different frequency offsets, which may cover both the Doppler induced frequency offset due to satellite velocity as well as any frequency offset of LO signal 127 (FIG. 1) resulting from crystal oscillator 124 (FIG. 1). The sample time error and the frequency offset of crystal oscillator 124 may substantially exceed any time drift and frequency drift of reference clocks on GPS satellites. In some embodiments, predetermined frequency offsets 235 may comprise all possible frequency offsets between a reference frequency generated from the crystal oscillator 124 (FIG. 1) and reference frequencies of reference clocks of the GPS satellites.

In some embodiments, the resampling may be performed in parallel for each of the plurality of sample rates 233, although the scope of the invention is not limited in this respect. In some embodiments, the resampling may be done in a serial manner. Buffered samples 203 may comprise complex I and Q samples generated from the received signals.

In some embodiments, the search performed by cross correlator 206 does not need to be grid based. In these embodiments, once a GPS satellite is detected with reasonable certainty at a particular time drift and frequency offset, resample controller 234 may cause the search to continue around that particular time drift and frequency offset until acquisition is achieved, although the scope of the invention is not limited in this respect.

In some embodiments, coherent combining may be performed for a period of a GPS symbol to detect the time and frequency offset of a GPS satellite. In some embodiments, a period longer than the period of a GPS symbol may be used for sample rates 233 and various bit sequences may be tried, although the scope of the invention is not limited in this respect. In some embodiments, many or all possible bit sequences may be used in order to increase the correlation length. For example, if a single sequence is represented as S1, that sequence may be multiplied by +1 or −1 and used to search new sequences +S1, +S1 and +S1, −S1, although the scope of the invention is not limited in this respect.

Referring to FIG. 1, in some embodiments, a hypothesis on the sample time error (crystal offset), time offset and a reliability metric (e.g., from the correlation) may be stored for each correlation. In these embodiments, the most reliable metric may be used to correct the sample rate (i.e., of sample clock signal 125) to allow receiver 100 to proceed with reception of GPS signals in a conventional manner.

Once the frequency offset is determined during acquisition, it may be applied as crystal correction signal 121 to correct the frequency of crystal oscillator 124 for use in subsequent data demodulation and tracking operations.

In the embodiments illustrated in FIG. 2A, resampling circuitry 204 may comprise resampler 232 to resample buffered samples 203 from I & Q buffer 202 at the plurality of sample rates 233. Complex multiplier 236 may frequency shift the resampled samples from resampler 232 with each of the predetermined frequency offsets 235 to generate frequency-shifted samples 237. In these embodiments, cross correlator 206 may perform cross correlations with the frequency-shifted samples 237 and known GPS symbols 209 stored in GPS read-only memory (ROM) 208 for each resampling operation performed by the resampler 232 to generate a correlation output 207.

In some embodiments illustrated in FIG. 2A, resampling circuitry 204 may include resample controller 234 to generate each of the predetermined frequency offsets 235 for application by the complex multiplier 236. Resample controller 234 may individually provide the predetermined frequency offsets 235 to complex multiplier 236 for each resampling operation performed by the resampler 232. In some other embodiments illustrated in FIG. 2A, resample controller 234 may provide each of the predetermined frequency offsets 235 from a table 210.

In some embodiments illustrated in FIG. 2B, resampling circuitry 214 may comprise resampler 242 to resample samples 203 at the plurality of sample rates 233. Complex multiplier 246 to apply a frequency shift to known GPS symbols 209 by applying each of the predetermined frequency offsets 245 to generate frequency-shifted reference sequences 247. In these embodiments, cross correlator 206 may perform a cross correlation with resampled signals 243 from the resampler 242 and the frequency-shifted reference sequences 247 for each resampling operation performed by the resampler 242. In some of these embodiments, resample controller 234 may generate each of the predetermined frequency offsets 245 for application by the complex multiplier 236 and may individually provide the predetermined frequency offsets 245 to the complex multiplier 236 for each resampling operation performed by the resampler 232. In some other embodiments illustrated in FIG. 2B, resample controller 234 may provide each of the predetermined frequency offsets 245 from a table 210, although the scope of the invention is not limited in this respect.

In some embodiments illustrated in FIG. 2C, cross correlator 206 may perform a cross correlation with resampled signals 243 from resampling circuitry 224 and one of a plurality of frequency-shifted reference sequences 247 for each resampling operation performed by the resampler 232. In these embodiments, table 228 may store the plurality of frequency-shifted reference sequences 247. In these embodiments, the plurality of sample rates 233 and the plurality of frequency-shifted reference sequences 247 are determined from all possible frequency offsets of the crystal oscillator 124 (FIG. 1) and a frequency output of the reference clocks of the GPS satellites.

Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices. Furthermore, as used herein, a computing device includes one or more processing elements coupled with computer-readable memory that may be volatile or non-volatile memory or a combination thereof.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A method performed by a global positioning system (GPS) receiver for acquisition of GPS signals for use in determining a geographic location, the method comprising resampling GPS signals at each of a plurality of different sample rates for each of a plurality of predetermined frequency offsets to compensate for sample time error and frequency offset of a crystal oscillator,
    wherein the resampling at different sample rates provides samples at different time-locations; and
    wherein the predetermined frequency offsets comprise possible frequency offsets between a reference frequency generated from the crystal oscillator and a reference frequency of the reference clocks of the GPS satellites.

2. The method of claim 1 wherein the method further comprises cross-correlating the resampled GPS signals for each of the predetermined frequency offsets,
    wherein the sample time error and the frequency offset of the crystal oscillator exceeds a time and frequency drift of reference clocks on GPS satellites.

3. The method of claim 2 wherein the resampling is performed in parallel on samples for each of the plurality of sample rates, and
    wherein the samples comprise complex I and Q samples generated from the GPS signals.

4. The method of claim 2 further comprising frequency shifting the resampled signals with each of the predetermined frequency offsets after the resampling to generate frequency-shifted samples, and
    wherein the cross correlating comprises performing cross correlations with the frequency-shifted samples and known GPS symbols for each resampling operation to generate a correlation output.

5. The method of claim 2 further comprising applying a frequency shift to known GPS symbols by applying each of the predetermined frequency offsets to generate frequency-shifted reference sequences,
    wherein the cross correlating comprises performing cross correlations with resampled signals and the frequency-shifted reference sequences for each resampling operation.

6. The method of claim 2 wherein the cross correlating comprises performing cross correlations with resampled outputs from the resampling and one of a plurality of frequency-shifted reference sequences for each resampling operation,
    wherein the plurality of frequency-shifted reference sequences are stored in a table, and
    wherein the plurality of sample rates and the plurality of frequency-shifted reference sequences are determined from possible frequency offsets between a frequency output of a crystal oscillator of a GPS receiver and a frequency output of the reference clocks of the GPS satellites.

7. The method of claim 2 further comprising performing coherent combining for a period longer than a period of a GPS symbol to detect time and frequency offset of a GPS satellite, and
    wherein the cross correlating comprises performing cross correlations using a plurality of reference sequences to increase a correlation length.

8. A GPS receiver comprising:
    resampling circuitry to resample received GPS signals at each of a plurality of different sample rates to provide samples at different time-locations; and
    a cross correlator to cross correlate the resampled signals for each of a plurality of predetermined frequency offsets,
    wherein resampling operations performed by the resampling circuitry at the plurality of sample rates, and cross correlation operations performed by the cross correlator for the predetermined frequency offsets, compensate for sample time error and frequency offset of a crystal oscillator within the GPS receiver, and
    wherein the predetermined frequency offsets comprise possible frequency offsets between a reference frequency generated from the crystal oscillator and a reference frequency of reference clocks of the GPS satellites.

9. The GPS receiver of claim 8 wherein the sample time error and the frequency offset of the crystal oscillator exceed time and frequency drift of reference clocks on GPS satellites.

10. The GPS receiver of claim 9 wherein the resampling is performed in parallel on samples for each of the plurality of sample rates, and
    wherein the samples comprise complex I and Q samples generated from the received signals.

11. The GPS receiver of claim 8 wherein the resampling circuitry comprises:
    a resampler to resample the received GPS signals at the plurality of sample rates;
    a complex multiplier to frequency shift the resampled signals from the resampler with each of the predetermined frequency offsets to generate frequency-shifted samples; and
    wherein the cross correlator performs cross correlations with the frequency-shifted samples and known GPS symbols for each resampling operation performed by the resampler, to generate a correlation output.

12. The GPS receiver of claim 8 wherein the resampling circuitry comprises:
- a resampler to resample the received GPS signals at the plurality of sample rates;
- a complex multiplier to apply a frequency shift to known GPS symbols by applying each of the predetermined frequency offsets to generate frequency-shifted reference sequences;
- wherein the cross correlator performs a cross correlation with resampled signals from the resampler and the frequency-shifted reference sequences for each resampling operation performed by the resampler.

13. The GPS receiver of claim 8 wherein the cross correlator performs a cross correlation with resampled outputs from the resampling circuitry and one of a plurality of frequency-shifted reference sequences for each resampling operation; and
- a table to store the plurality of frequency-shifted reference sequences,
- wherein the plurality of sample rates and the plurality of frequency-shifted reference sequences are determined from possible frequency offsets and between a frequency output of the crystal oscillator and a frequency output of reference clocks of GPS satellites.

14. The GPS receiver of claim 8 wherein the crystal oscillator is a frequency controlled crystal oscillator used by a synthesizer for generating a LO frequency and a sample clock for the GPS receiver.

15. A GPS receiver comprising:
- resampling circuitry to resample received GPS signals at each of a plurality of different sample rates to provide samples at different time-locations; and
- a cross correlator to cross correlate the resampled signals for each of a plurality of predetermined frequency offsets,
- wherein resampling operations performed by the resampling circuitry at the plurality of sample rates, and cross correlation operations performed by the cross correlator for the predetermined frequency offsets, compensate for sample time error and frequency offset of a crystal oscillator within the GPS receiver,
- wherein the resampling circuitry comprises:
- a resampler to resample the received GPS signals at the plurality of sample rates;
- a complex multiplier to frequency shift the resampled signals from the resampler with each of the predetermined frequency offsets to generate frequency-shifted samples; and
- wherein the cross correlator performs cross correlations with the frequency-shifted samples and known GPS symbols for each resampling operation performed by the resampler, to generate a correlation output,
- wherein the GPS receiver further comprises a resample controller to either generate each of the predetermined frequency offsets for application by the complex multiplier or provide each of the predetermined frequency offsets from a table, and
- wherein the resample controller individually provides the predetermined frequency offsets to the complex multiplier for each resampling operation performed by the resampler.

16. A GPS receiver comprising:
- resampling circuitry to resample received GPS signals at each of a plurality of different sample rates to provide samples at different time-locations; and
- a cross correlator to cross correlate the resampled signals for each of a plurality of predetermined frequency offsets,
- wherein resampling operations performed by the resampling circuitry at the plurality of sample rates, and cross correlation operations performed by the cross correlator for the predetermined frequency offsets, compensate for sample time error and frequency offset of a crystal oscillator within the GPS receiver,
- wherein the resampling circuitry comprises:
- a resampler to resample the received GPS signals at the plurality of sample rates; and
- a complex multiplier to apply a frequency shift to known GPS symbols by applying each of the predetermined frequency offsets to generate frequency-shifted reference sequences,
- wherein the cross correlator performs a cross correlation with resampled signals from the resampler and the frequency-shifted reference sequences for each resampling operation performed by the resampler,
- wherein the GPS receiver further comprises a resample controller to either generate each of the predetermined frequency offsets for application by the complex multiplier or provide each of the predetermined frequency offsets from a table, and
- wherein the resample controller individually provides the predetermined frequency offsets to the complex multiplier for each resampling operation performed by the resampler.

17. A spread spectrum receiver comprising:
- resampling circuitry to resample received GPS signals at each of a plurality of different sample rates to provide samples at different time-locations; and
- a cross correlator to cross correlate the resampled signals for each of a plurality of predetermined frequency offsets,
- wherein resampling operations performed by the resampling circuitry at the plurality of sample rates, and cross correlation operations performed by the cross correlator for the predetermined frequency offsets compensate for sample time error and frequency offset of a crystal oscillator within the receiver,
- wherein the cross correlator performs a cross correlation with resampled outputs from the resampling circuitry and one of a plurality of frequency-shifted reference sequences for each resampling operation, and
- wherein the plurality of sample rates and the plurality of frequency-shifted reference sequences are determined from possible frequency offsets and between a frequency output of the crystal oscillator and a frequency output of system reference clocks.

18. The receiver of claim 17 wherein the resampling circuitry comprises:
- a resampler to resample the received GPS signals at the plurality of sample rates;
- a complex multiplier to frequency shift the resampled received GPS signals from the resampler with each of the predetermined frequency offsets to generate frequency-shifted samples; and
- wherein the cross correlator performs cross correlations with the frequency-shifted samples and known GPS symbols for each resampling operation performed by the resampler to generate a correlation output.

19. The receiver of claim 17 wherein the resampling circuitry comprises:
- a resampler to resample the received GPS signals at the plurality of sample rates;

a complex multiplier to apply a frequency shift to known GPS symbols by applying each of the predetermined frequency offsets to generate frequency-shifted reference sequences;

wherein the cross correlator performs a cross correlation with resampled GPS signals from the resampler and the frequency-shifted reference sequences for each resampling operation performed by the resampler.

20. The receiver of claim 17 wherein the cross correlator performs a cross correlation with resampled outputs from the resampling circuitry and one of a plurality of frequency-shifted reference sequences for each resampling operation performed by the resampler, wherein the receiver further comprises a table to store the plurality of frequency-shifted reference sequences.

* * * * *